US010418984B2

(12) United States Patent
Bakalski

(10) Patent No.: US 10,418,984 B2
(45) Date of Patent: Sep. 17, 2019

(54) SWITCH

(71) Applicant: Infineon Technologies AG, Neubiberg (DE)

(72) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 119 days.

(21) Appl. No.: 15/631,591

(22) Filed: Jun. 23, 2017

(65) Prior Publication Data

US 2017/0373680 A1    Dec. 28, 2017

(30) Foreign Application Priority Data

Jun. 24, 2016   (DE) .................. 10 2016 111 641

(51) Int. Cl.
| | | |
|---|---|---|
| *H01P 1/15* | (2006.01) | |
| *H03K 17/081* | (2006.01) | |
| *H02H 9/04* | (2006.01) | |
| *H03H 7/01* | (2006.01) | |
| *H01L 27/00* | (2006.01) | |
| *H03H 11/28* | (2006.01) | |

(52) U.S. Cl.
CPC ....... *H03K 17/08104* (2013.01); *H02H 9/046* (2013.01); *H03H 7/0123* (2013.01); *H03H 11/28* (2013.01)

(58) Field of Classification Search
CPC ... H01P 1/15; H02H 3/02; H02H 3/20; H02H 3/22; H03K 17/081; H03K 17/687
USPC ................... 333/101, 103; 361/56
See application file for complete search history.

(56) References Cited

U.S. PATENT DOCUMENTS

| | | | |
|---|---|---|---|
| 4,317,055 A | 2/1982 | Yoshida et al. | |
| 5,870,268 A * | 2/1999 | Lin ................ | H01L 27/0251 257/355 |
| 5,946,175 A * | 8/1999 | Yu ................. | H03K 17/08122 361/56 |
| 6,573,752 B1 | 6/2003 | Killat | |
| 7,660,087 B2 * | 2/2010 | Huang ............ | H02H 9/046 361/56 |
| 8,072,722 B1 | 12/2011 | Hwang | |
| 8,461,903 B1 | 6/2013 | Granger-Jones | |
| 8,760,828 B2 | 6/2014 | Ma | |
| 9,627,882 B2 * | 4/2017 | Bakalski ......... | H02H 9/04 |
| 9,895,879 B2 * | 2/2018 | Fujii .............. | H01L 27/027 |
| 2009/0073620 A1 | 3/2009 | Mergens et al. | |

(Continued)

OTHER PUBLICATIONS

Shifrin, Mitchell B. et al., "Monolithic FET Structures for High-Power Control Component Applications", IEEE Transactions on Microwave Theory and Techniques, vol. 37, No. 12, Dec. 1989, pp. 2134-2141.

*Primary Examiner* — Dean O Takaoka
(74) *Attorney, Agent, or Firm* — Murphy, Bilak & Homiller, PLLC

(57) ABSTRACT

A switch includes an input terminal, an output terminal, and a stack including transistors, such as, for example, field effect transistors, coupled in series, the stack being coupled between the input terminal and the output terminal. The switch also includes at least one switching element configured to be selectively operated in a conducting state or a non-conducting state, and at least one overvoltage protection element coupled to the stack by the at least one switching element. By way of example, the switch can implement a radio-frequency switch.

16 Claims, 2 Drawing Sheets

(56) References Cited

U.S. PATENT DOCUMENTS

| | | |
|---|---|---|
| 2010/0265622 A1 | 10/2010 | Campi, Jr. et al. |
| 2013/0258535 A1* | 10/2013 | Kim ........................ H02H 3/20 |
| | | 361/56 |
| 2015/0162901 A1 | 6/2015 | Lu et al. |
| 2016/0087423 A1* | 3/2016 | Chen ...................... H02H 9/046 |
| | | 361/56 |
| 2018/0052479 A1* | 2/2018 | Bakalski ................. G05F 3/205 |

* cited by examiner

SWITCH

TECHNICAL FIELD

Various embodiments relate to a switch comprising an input terminal, an output terminal, and a stack comprising transistors coupled in series, the stack being coupled between the input terminal and the output terminal. The switch also comprises at least one switching element, which can selectively be operated in a conducting state or a non-conducting state, and at least one overvoltage protection element coupled to the stack via the at least one switching element.

BACKGROUND

Radio-frequency (RF) switches are used in a multiplicity of RF circuits in order to implement different functions. Resonant circuits can be set for resonance operation for example by means of an RF switch. Such resonant circuits can be used for example as antennas in mobile communication devices.

In detail, for example, a communication system that uses different frequencies for different signalling methods can be implemented using a network of RF switches. The RF switches can be used to select between different types of RF front-end circuits. One example of such a communication system is a multi-standard mobile telephone that can carry out telephone calls using different standards, such as, for example, Third Generation Partnership Project (3GPP) Code Division Multiple Access (CDMA) or 3GPP Global System for Mobile Communications (GSM) or 3GPP Long Term Evolution (LTE). One and the same communication standard, moreover, can use different frequencies e.g. depending on the network operator. Using an RF switch, an RF front-end circuit optimized for CDMA communication can be used for CDMA telephone calls; while an RF front-end circuit optimized for GSM communication can be used for GSM telephone calls.

Furthermore, RF switches can be used to implement settable matching networks for antennas or power amplifiers. In this way it is possible to provide settable adjustment of RF filters by connection and disconnection and/or bypassing of passive matching and setting elements.

In order to provide RF switches having a particularly high dielectric strength, techniques are known which use a stack comprising field effect transistors (FETs) coupled in series. Typical dielectric strengths for switches are e.g. in the region of 24 V for 50-ohm mobile radio applications and up to 100 V on antenna resonant circuits for an open state of the switch. Since the individual components of typical production techniques such as, for example, the complementary metal oxide semiconductor (CMOS) process are not designed for such high voltages, the stacked arrangement of a multiplicity of FETs is used. The voltage can then be distributed among the multiplicity of FETs, such that each individual FET is exposed only to a lower voltage. By way of example, individual FETs in a CMOS silicon-on-insulator (SOI) process typically have a maximum dielectric strength between source contact and drain contact of 2.5 V. 40 FETs, for example, are then stacked in order to obtain the dielectric strength of 100 V; see U.S. Pat. No. 4,317,055, for example, for corresponding techniques.

However, such RF switches have certain disadvantages and/or limitations. By way of example, it may be possible that a lower limiting frequency for the voltage change at the input terminal exists for a specific dimensioning of the components used; see Shifrin, Mitchell B., Peter J. Katzin, and Yalcin Ayasli. "Monolithic FET structures for high-power control component applications." IEEE Trans. Microwave Theory and Techniques, 37 (1989) 2134-2141; equations 12, 14 and 15. If the voltage at the input terminal varies with a frequency that is lower than said limiting frequency, damage to the FETs used can occur. The switch can thus become unusable.

A slow variation of the voltages over time can often occur in association with electrostatic discharge (ESD).

U.S. Pat. No. 8,461,903 B1 discloses techniques in which comparatively fast switchover times can be achieved despite a conservative dimensioning of the components used—and thus an improved robustness vis à vis ESD events. However, a corresponding switch can be comparatively complicated and costly in terms of production. Moreover, a corresponding switch typically requires a PMOS transistor; however, a corresponding transistor is not available in various production techniques, with the result that such techniques cannot be usable or can be usable only to a limited extent.

SUMMARY

Various embodiments relate to a switch comprising an input terminal, an output terminal, and a stack comprising transistors coupled in series, said stack being coupled between the input terminal and the output terminal. The switch also comprises at least one switching element, which can selectively be operated in a conducting state or a non-conducting state, and at least one overvoltage protection element coupled to the stack by means of the at least one switching element.

Various embodiments relate to selectively activating, using at least one switching element, an overvoltage protection element coupled to a stack comprising transistors coupled in series.

The features set out above and features described below can be used not only in the corresponding combinations explicitly set out, but also in further combinations or in isolation, without departing from the scope of protection of the present invention.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
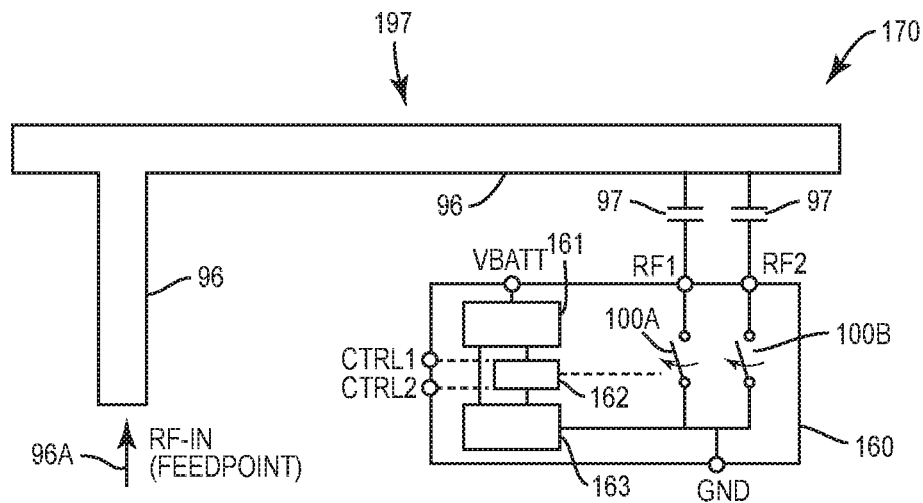
FIG. 1 illustrates two RF switches which are used in interaction with an LC resonant circuit in the form of an antenna tuning.

The above-described properties, features and advantages of this invention and the way in which they are achieved will become clearer and more clearly understood in association with the following description of the exemplary embodiments which are explained in greater detail in association with the drawings.

The present invention is explained in greater detail below on the basis of preferred embodiments with reference to the drawings. In the figures, identical reference signs designate identical or similar elements. The figures are schematic representations of various embodiments of the invention. Elements illustrated in the figures are not necessarily illustrated in a manner true to scale. Rather, the various elements illustrated in the figures are rendered in such a way that their function and general purpose becomes understandable to the person skilled in the art. Connections and couplings between functional units and elements as illustrated in the figures can also be implemented as indirect connection or coupling. A connection or coupling can be implemented in a wired or wireless manner. Functional units can be implemented as hardware, software or a combination of hardware and software.

A description is given below of techniques for implementing an electronic switch. The switch can switch electrical current flow and/or voltage. In particular, a description is given of techniques for implementing an RF switch suitable for switching a radio-frequency voltage. In this case, RF may denote for example such frequencies that are greater than 800 MHz, or are >1 GHz or are >2 GHz.

A description is given below of techniques for implementing an RF switch which is particularly robust vis à vis ESD events.

Typically, such states in which a low-frequency voltage having a significant amplitude is present on account of a discharge, for example, can be designated as an ESD event. By way of example, an ESD event can be caused on account of the manual handling of a corresponding RF switch. ESD events can have e.g. frequencies in the range of a few MHz, i.e. significantly lower frequencies than RF. ESD events can be described by a wide variety of models. One example of a corresponding model is the so-called human body model (HBM).

The switch can comprise for example a stack comprising transistors coupled in series. In this configuration, a limited dielectric strength of individual transistors of the stack can be compensated for by the series connection of a plurality of transistors.

Reference is primarily made below to examples in which the transistors are implemented by FETs. Examples of FETs are e.g.: metal-oxide-semiconductor FETs (MOSFETs); junction field effect transistor (JFET); high-electron-mobility transistor (HEMT); Schottky field effect transistor or metal-semiconductor field effect transistor (MESFET); insulated gate field effect transistor (IGFET); metal-insulator-semiconductor field effect transistor (MISFET); organic field effect transistors (OFET); and chemically sensitive field effect transistors (ChemFET). In other examples, however, the transistors can also be implemented e.g. by bipolar transistors.

In various examples, the switch comprises an overvoltage protection element. The overvoltage protection element is connected to the stack by means of a switching element. The switching element can selectively be operated in a conducting (i.e. closed) state or a non-conducting (that is to say open) state. By way of example, the switching element could be implemented by a transistor, for instance a FET.

The invention is based on the insight that, with regard to protection from ESD events, it is possible to differentiate between different operating modes. By way of example, ESD events may occur with increased prevalence during the production of the switch. During the production of the switch, the switch may be subjected to various handling steps. Therefore, ESD events may occur particularly frequently. Therefore, the ESD protection may be particularly necessary precisely during production. On the other hand, during operation by the end user, the ESD protection may not be necessary or may be necessary only to a limited extent. This may be the case since the switch may be embedded into a housing during intended operation, which provides ESD protection on a structural basis. Moreover, during intended operation, the switch may be arranged on a printed circuit board having further passive electronic components. These passive components often implement a protection functionality vis à vis ESD events.

The switching element and/or the coupling of the overvoltage protection element to the stack by means of the switching element may be configured to selectively switch on and off the ESD protection functionality of the overvoltage protection element for the stack. As a result, it may be possible for operation that is optimized in relation to the ESD protection functionality to be implemented. The ESD protection functionality may be selectively enabled or disabled. During an operating mode which is particularly exposed in relation to ESD events, the switching element can be operated in a state which has the effect that the overvoltage protection element can manifest its ESD protection functionality for the stack; during a further operating mode, which is not particularly exposed in relation to ESD events, the switching element can be operated in a state which has the effect that the overvoltage protection element cannot manifest its ESD protection functionality for the stack, but the other characteristic variables—such as switching speed, dielectric strength, channel resistance, capacitance in the non-conducting state, and/or linearity, etc.—of the switch are not adversely influenced. The RF performance characteristic of the RF switch may be particularly good.

Depending on the implementation of the coupling between the switching element and the overvoltage protection element, the ESD protection functionality can be provided by the overvoltage protection element for the stack in the conducting or non-conducting state of the switching element.

FIG. 1 shows a system 170, comprising two RF switches 100A, 100B. Each of the RF switches 100A, 100B can be embodied in accordance with the techniques described herein.

The system 170 comprises a metal conductor 96, which can be embodied as inductance for an LC resonant circuit 197. An RF signal 96A is fed into the metal conductor 96. The metal conductor 96 is coupled to ground in each case via two differently dimensioned capacitors 97 and assigned switches 100A, 100B. The metal conductor 96 and the capacitors 97 form the LC resonant circuit 197. The LC resonant circuit 197 can implement an antenna, for example; in this case, the antenna acts as a resonance reservoir.

In this case, the switches 100A, 100B can be operated in a closed state or an open state. In the open state, a low conductivity is present (non-conducting state); in the closed state, a high conductivity is present (conducting state). Depending on the state in which the switches 100A, 100B are operated, a different capacitor 97 interacts with the conductor track 96; in this way, resonant operation of the LC resonant circuit can be achieved for different frequencies. The resonant operation enables a high transmission power and energy-efficient operation for the respectively activated frequency band.

In this case, the switches 100A, 100B are part of an electrical circuit 160 that also comprises a charge pump 163, a driver 162 and a voltage regulator 161. The driver 162 is used to operate the switches 100A, 100B in each case selectively in the conducting or non-conducting state. The driver 162 therefore implements control functionality. The charge pump 163 provides the charge for the switching. The charge pump 163 can optionally also apply negative voltage to the substrate. The voltage regulator 161 controls the components 162, 163.

Figure 2:
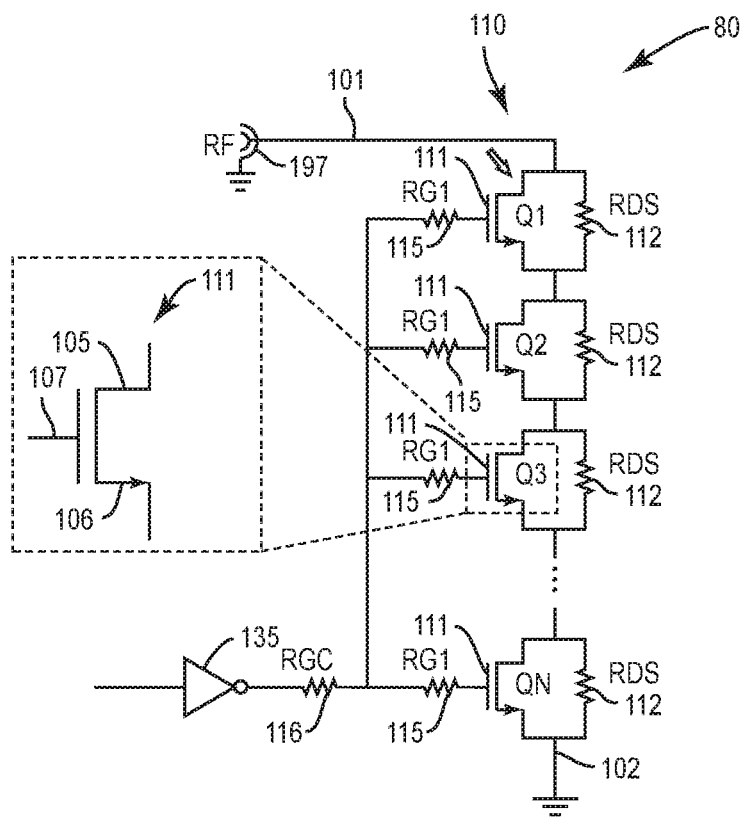
FIG. 2 schematically illustrates the construction of an RF switch in accordance with reference implementations.

FIG. 2 illustrates an RF switch 80 in accordance with a reference implementation. The RF switch 80 comprises a stack 110 comprising a plurality of FETs 111. The FETs 111—for example N-channel FETs—are connected in series; the RF switch 80 thus comprises a series connection of the FETs 111. In this case, a respective source contact 106 is coupled to the drain contact 105 of the respectively adjacent FET 111; the state of the FET 111 is controlled via the gate contact 107 (cf. inset in FIG. 2; the inset is enclosed by a dashed border in FIG. 2).

The LC resonant circuit 197 is connected to the input terminal 101. Ground is connected to the output terminal 102.

Resistors 112 are provided between the drain contacts 105 and the source contacts 106. The resistors 112 have high resistances, i.e. have for example resistance values in the range of 20-40 kohms. The resistors 112 prevent undefined floating of the potentials of the source contacts 106 and drain contacts 105 of the various FETs 111 in the non-conducting state.

A driver 135 is coupled to the gate contacts of the various FETs 111 via gate contact resistors 115, 116. The gate contact resistors 115, 116 and the gate capacitances of the gate contacts 107 define the time constant of the respective FET 111:

$$\tau = RC, \quad (1)$$

wherein R defines the value of the respective gate contact resistor 115, 116; and C defines the value of the respective gate capacitance. The gate capacitance is typically proportional to the gate width. A further influencing factor for the gate capacitance may be the gate length. Typical gate widths for a FET may be e.g. in the range of 4-6 mm, wherein e.g. 4 sets each of 100 FET fingers are used here per FET 111, wherein each finger in turn has a gate width of 15 µm. Typical gate lengths for a FET may be e.g. in the range of 10-500 nm, e.g. in the range of 100-120 nm.

In principle, a faster switchover, i.e. a smaller time constant or a time constant corresponding to a shorter time, is worthwhile here. On the other hand, a faulty behaviour or damage of one or more of the FETs 111 may occur in association with comparatively small time constants for slow ESD events. In particular, a non-uniform distribution of the voltage via the various FETs 111 may occur in this case. This is explained below.

If a slow voltage pulse—i.e. with a frequency spectrum significantly below RF—is present at the input terminal 101: as a result of a parasitic capacitive coupling between the drain contact 105 and the gate contact 107 of the FET 111 adjacent to the input terminal 101 (said FET being illustrated at the very top and highlighted by the arrow in FIG. 2), this topmost FET 111 is opened; however, on account of the comparatively small time constant, the charge flows away from the gate contact 107 rapidly via the gate contact resistor 115, 116 and said FET 111 closes again. As a result, a particularly high voltage is present between the drain contact 105 and the source contact 106 of the topmost FET 111; this voltage can be greater than the breakdown voltage that can be present in the non-conducting state between drain contact 105 and source contact 106. The FET 111 can be damaged as a result.

For a quantitative explanation of this effect, see the abovementioned publication by Shifrin, Mitchell B. et al.: equ. 15.

A description is given below of how an effective ESD protection can be achieved despite a small dimensioning of the time constants for the FETs 111. A description is given below of, in particular, techniques which enable efficient ESD protection without significant reduction of the RF performance characteristic of the RF switch 100.

Figure 3:
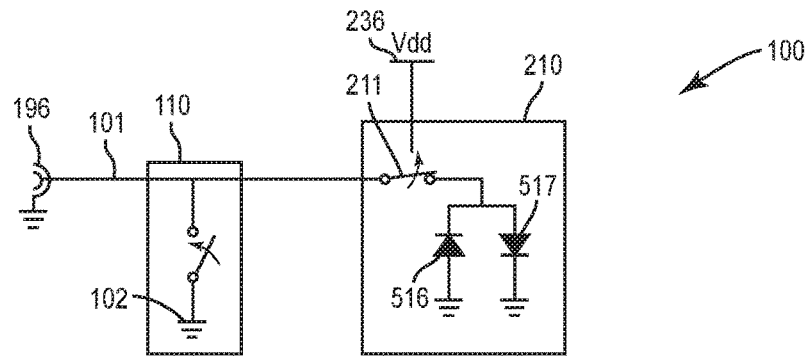
FIG. 3 schematically illustrates the construction of an RF switch with an overvoltage protection element in accordance with various embodiments.

FIG. 3 illustrates aspects with regard to an overvoltage protection element 210. The overvoltage protection element 210 provides an ESD protection functionality for the stack 110.

In the example in FIG. 3, the overvoltage protection element 210 is illustrated schematically by two oppositely biased diodes 516, 517. In general, however, it is also possible to use other implementations for the overvoltage protection element 210. One example is particular forms of NPN or PNP protection transistors. The latter can comprise a stage collector, for example. The collector current and/or emitter current can thereby be limited. A further example concerns diodes on an insulator substrate or else ESD polymer diodes. A further example concerns inductances that represent a short circuit at low frequency. It is clear from the above that many different examples can be chosen for the overvoltage protection element 210.

The overvoltage protection element 210 is connected to the stack 110 by means of a switching element 211. In the example in FIG. 3, the overvoltage protection element 210 is connected to the stack 110 in particular in series connection with the switching element 211. In other examples, other couplings of the overvoltage protection element 210 to the stack 110 and the switching element 211 are possible.

While the switching element 211 is illustrated as part of the overvoltage protection element 210 in the example in FIG. 3, in other exemplary implementations it may also be possible for the switching element 211 to be implemented separately.

The functioning of the switch 100 is explained in greater detail below. In particular, the functioning of the switching element 211 in relation to the ESD protection functionality provided by the overvoltage protection element 210 is explained in greater detail below.

The switching element 211 can be selectively operated in a conducting state or a non-conducting state. This means that the overvoltage protection element 210 selectively provides the ESD protection functionality, depending on the operating mode of the switching element 211. As a result, it may be possible to selectively operate the switch 100 in a first operating mode optimized in relation to the ESD protection functionality, and in a second operating mode optimized in relation to the RF performance characteristic of the switch 100.

In the example in FIG. 3, the switching element 211 is switched depending on a value of the supply voltage VDD present at a supply terminal 236. By way of example, if the intended supply voltage is present at the supply terminal 236—that is to say that the value of the supply voltage assumes for example VDD=+5 V—the switching element 211 can be operated in the non-conducting state. As a result, the diodes 516, 517 are not coupled to the stack 110; as a result, no ESD protection functionality is provided, but at the same time the RF performance characteristic of the switch 100 is not reduced by the diodes 516, 517. If the value of the supply voltage is close to, for example, VDD=0 V, the switching element can be operated in the conducting state. As a result, the diodes 516, 517 are coupled to the stack 110; as a result, the ESD protection functionality is provided, but at the same time the RF performance characteristic of the switch 100 is reduced by the diodes 516, 517. Since a value of VDD=0 V of the supply voltage is typically not present during intended or normal operation of the switch 100, such a reduction of the RF performance of the switch 100 can be tolerated. By way of example, the supply voltage can assume a value of VDD=0 V during the production of the switch 100.

Figure 4:
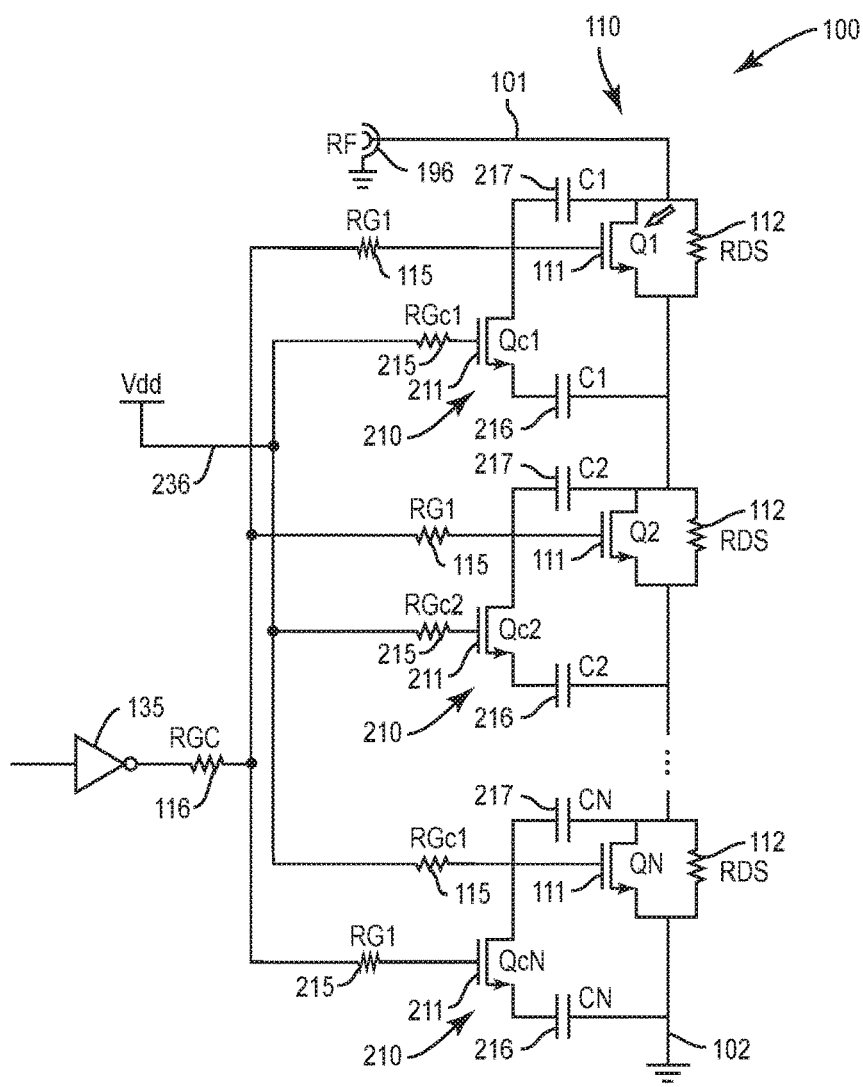
FIG. 4 schematically illustrates the construction of an RF switch in accordance with various embodiments, wherein the RF switch comprises a plurality of overvoltage protection elements which are assigned to different FETs of the RF switch and each comprise two capacitors.

FIG. 4 illustrates aspects with regard to an exemplary implementation of the overvoltage protection element 210. In this case, the switch 100 in accordance with the example in FIG. 4 corresponds, in principle, to the switch 80 in accordance with the example in FIG. 2: once again the stack 110 comprising a plurality of FETs 111 coupled in series is present.

In the example in FIG. 4, an associated overvoltage protection element 210 is assigned to each FET 111. Each overvoltage protection element 210 is coupled to the assigned FET 111 of the stack 110 by means of a corresponding switching element 211. This means that the same number of overvoltage protection elements 210 and FETs 111 and switching elements 211 is present.

In the example in FIG. 4, the switching elements 211 are implemented by FETs. In general, however, it would be possible to implement the switching elements 211 differently, for example by bipolar transistors, or other types of field effect transistors, etc. By way of example, the switching elements 211 can be implemented by one of the following elements: MOSFETs; JFETs; HEMTs; MESFETs; IGFETs; MISFETs; OFETs; and ChemFETs.

The gate contacts of the switching elements 211 are once again coupled to the supply terminal 236 in the example in FIG. 4. This means that the switching elements 211 are selectively operated in the conducting or non-conducting state depending on the supply voltage VDD.

It is evident from FIG. 4 that each overvoltage protection element 210 comprises a capacitor 216. Each capacitor 216 is coupled in series with the respectively assigned switching element 211 between the corresponding gate contact 107 and the source contact 106 of the respective FET 111 of the stack 110. In FIG. 4, the source contact of the FET that implements the respective switching element 211 is coupled to the corresponding capacitor 216; the drain contact of said FET is coupled to the gate contact 107 of the respective FET 111 of the stack 110. The capacitors 216 achieve—selectively in the conducting state of the switching element 211—an amplified capacitive coupling between the source contact 106 and the gate contact 107 of the FETs 111 of the stack 110.

Each overvoltage protection element 210 also comprises a capacitor 217 coupled between the gate contact 107 and the drain contact 105 of the respectively assigned FET 111. The capacitors 217 achieve an amplified capacitive coupling between the drain contact 105 and the gate contact 107 of the FETs 111 of the stack 110.

The functioning of the overvoltage protection elements 210 is explained below. If the magnitude of the value of the supply voltage VDD exceeds a predefined threshold value, the switching elements 211 are operated in the conducting state. This means that the capacitors 216 connect the gate contact 107 to the source contact 106. As a result, an amplified capacitive coupling between the gate contact 107 and the source contact 106 is achieved (in addition to the parasitic capacitive coupling). In this case, the capacitive coupling is increased by the capacitance value of the respective capacitor 216. In this case, it may be worthwhile for the capacitance value of the respective capacitor to be not less than 1 pF, optionally not less than 2 pF, further optionally not less than 10 pF. A sufficiently strong capacitive coupling is achieved as a result.

By way of example, it would be possible for the capacitance value of the respective capacitor 216 to bring about an amplification of the inherent capacitive coupling between the gate contact 107 and the source contact 106 of the respective FET 111 by at least an additional factor of 0.5, optionally of at least 2, further optionally of 3.

For the case where the capacitance value of the respective capacitor 216 is approximately equal to the capacitance value of the respective capacitor 217, a symmetrical capacitive coupling between the drain contact 105 and the gate contact 107, and also the source contact 106 and the gate contact 107, is present. This brings about a linear characteristic curve of the switch 100: the voltage drop is distributed uniformly between the drain contact 105 and the gate contact 107 and the source contact 106 and the gate contact 107 of the respective field effect transistor 111. This means that the quality of the RF switch 100 is not restricted or is not significantly restricted by the overvoltage protection elements 210. If the switching elements 211 are conducting, the same capacitive coupling is thus obtained between the drain contact 105 and the gate contact 107, and also the source contact 106 and the gate contact 107. The voltage division ratio remains unchanged and the respective FET 111 has the same switching threshold as without an overvoltage protection element 210. The switching threshold corresponds to attaining the threshold voltage.

In the case of an asymmetrical capacitive coupling between the drain contact 105 and the gate contact 107, and also the source contact 106 and the gate contact 107, however, the voltage pulse is no longer distributed uniformly between gate-source and gate-drain; this therefore results in operation of the FET 111 in the conducting state before the threshold voltage is attained. Furthermore, an asymmetrical effective capacitive coupling between drain contact 105 and gate contact 107, on the one hand, and source contact 106 and gate contact 107, on the other hand, has the effect that the characteristic curve of the FET 111 is shifted in a frequency-dependent manner owing to Z=1/jwC. This, too, results in the transistor being switched on prematurely in the case of a radio-frequency voltage. This is typically undesirable.

However, if the magnitude of the value of the supply voltage VDD does not exceed the predefined threshold value, the switching elements 211 are operated in the non-conducting state. By way of example, the value of the supply voltage can be close to VDD=0 V if an integrated circuit (IC) comprising the switch 100 is switched off. The switch and a plurality of other active components which are coupled to the supply terminal 236 are then fed no energy by the supply voltage VDD. Such a state can be, for example, during the manufacture of the switch 100 or of the IC.

Since in such a state the switching elements 211 are operated in the non-conducting state, only the additional capacitance of the capacitor 217 is present between the drain contact 105 and the gate contact 107. The capacitance of the capacitors 216 is switched off. In such a case, a positive ESD pulse generates a fast switch-on of the FETs 111 since the threshold voltage is attained rapidly on account of the additional capacitive coupling provided by the capacitors 217. Damage on account of excessively high source-drain voltages is avoided as a result of the rapid switch-on of the FETs 111. The FETs 111 are switched to the conducting state before the breakdown voltage is attained. Even during the discharge via the gate contact resistors 115, the FETs 111 remain conducting on account of the additional capacitive coupling provided by the capacitors 217, such that damage is avoided.

As already mentioned, an asymmetrical capacitive coupling between drain contact 105 and gate contact 107, and source contact 106 and gate contact 107, generates an undesirable non-linear behaviour vis à vis the RF performance characteristic. By way of example, H2/H3 products can be generated. In this case, H2 and H3 denote second- and third-order harmonics, i.e. 2× fundamental frequency and 3× fundamental frequency. Such harmonics typically arise if a sinusoidal signal is cut off; this is a typical behaviour of a switch that switches prematurely. Since the asymmetrical capacitive coupling is implemented only for vanishing or small magnitudes of the value of the supply voltage VDD, however, this does not signify a limitation for normal operation.

With regard to FIG. 4 a scenario is illustrated in which a corresponding overvoltage protection element 210 is assigned to each FET 111 of the stack 110. In general, however, it would also be possible for just a single one or some of the FETs 111 of the stack 110 to have a corresponding assigned overvoltage protection element 210. By way of example, it would be possible for at least the FET 111 (illustrated at the very top and identified by the arrow in FIG. 4) arranged adjacent to the input terminal 101 in the stack 110 to have an assigned overvoltage protection element 210. This may be the case since the largest voltages in the case of an ESD event typically occur at the FET 111 arranged adjacent to the input terminal 101. A space-efficient ESD protection functionality can be provided as a result.

In an example in which a respective overvoltage protection element 210 is assigned to a plurality of FETs 111 (cf. FIG. 4), it would be possible for the capacitance values of the capacitors 216, 217 for different overvoltage protection elements 210 to be identical or to vary. By way of example, it would be possible for the capacitance values of the capacitors 216 for overvoltage protection elements 210 which are assigned to different FETs 111 to have a deviation with respect to one another of more than 2%, preferably more than 20%, particularly preferably more than 50%. Alternatively or additionally, it would be possible, for example, for the capacitance values of the capacitors 217 for overvoltage protection elements 210 which are assigned to different FETs 111 to have a deviation with respect to one another of more than 2%, preferably more than 20%, particularly preferably more than 50%. By varying the capacitance values, on the one hand it is possible to achieve an efficient ESD protection functionality; on the other hand it is possible to prevent the RF performance characteristic of the switch 100 from being reduced unnecessarily.

By way of example, it would be possible for such capacitors 216, 217 which belong to overvoltage protection elements 210 which are assigned to FETs 111 of the stack 110 which are arranged closer to (further away from) the input terminal 110 to have larger capacitance values (smaller capacitance values). What can be achieved as a result is that the RF performance characteristic of the switch 100 is influenced comparatively little by the provision of additional capacitive couplings between drain contacts 105, source contacts 106 and respectively the gate contacts 107; at the same time, however, a particularly efficient ESD protection functionality is made possible.

In other examples, it would also be possible for the capacitance values of corresponding capacitors 216, 217 for overvoltage protection elements 210 which are assigned to different FETs 111 to have a deviation with respect to one another of less than 50%, preferably less than 20%, particularly preferably less than 2%. In this way it may be possible to implement the capacitors 216, 217 particularly simply and space-efficiently. It is possible to use the same geometry for different capacitors 216, 217.

The implementation of the stack 110 in accordance with FIG. 4 is by way of example. The FETs 111 of the stack 110 could e.g. have additional capacitors (not illustrated in FIG. 4) connected between the corresponding drain contacts 105 and source contacts 106.

These capacitors can bring about an additional capacitance between the drain contacts 105 and source contacts 106 of the FETs 111 of the stack 110; as a result, the voltage in the non-conducting state can be distributed particularly symmetrically along the gate length of the respective FET 111. Non-linearities during the operation of the switch 100 can be avoided as a result.

Specifically, for example, a capacitance of the substrate can bring about additional non-linearities of the switch 100. These non-linearities are typically reduced significantly by the use of an SOI process. In an SOI process, the substrate, for example silicon, is electrically isolated by an insulator layer from the integrated structures of the switch 100, in particular from the FETs 111. In order to avoid an uncontrolled fluctuation (called floating) of the potential of the switch 100, it is possible for an additional body bias resistor to be provided per FET 111, which fixes the FETs 111 at a defined potential. It would alternatively or additionally also be possible to use a negative bias voltage for the substrate in order to switch off the substrate diodes and significantly reduce asymmetries as a result. In such cases, however, a significant parasitic contribution arises on account of the body bias resistor. This parasitic contribution can be compensated for by individual dimensioning of the capacitors 216, 217.

A description was given above, with regard to the examples in FIGS. 3 and 4, of scenarios in which the switching elements 211 are operated in the conducting or non-conducting state depending on the value of the supply voltage VDD. In other examples, however, it would also be possible to selectively operate the switching elements 211 in the conducting or non-conducting state depending on other variables. By way of example, it would be possible for the switching elements 211 to be operated in the conducting state or in the non-conducting state depending on an operating mode of the switch 100. The operating mode of the switch 100 can be determined for example by one or a plurality of state variables of a control logic of the switch 100. Alternatively or additionally, it would also be possible for the switch 100 to comprise a user interface—for example a contact pad, a pushbutton, etc.—which is configured to determine the operating mode by user input. It would also be possible for the at least one switching element 211 to be operated in the conducting state or non-conducting state depending on the presence of the RF signal 96A at the input terminal 101.

To summarize, a description was given above of techniques for providing an efficient ESD protection functionality for RF switches. These techniques are based on the use of one or a plurality of overvoltage protection elements which selectively provide the ESD protection functionality.

Such techniques can be implemented in particular in association with an established CMOS process. More complicated technologies such as, for example, GaN-based structures or micromechanical elements (micromechanical structure; MEMS) need not be used. By way of example, in contrast to U.S. Pat. No. 8,461,903 B1, no PMOS transistor is required. The required wiring outlay is limited; simple architectures are possible. By way of example, in contrast to U.S. Pat. No. 8,461,903 B1, complicated synchronization of the gate contacts during switchover is not required; suppression of the RF voltage during switchover in order to avoid damage is not necessary either. The PMOS transistor in accordance with U.S. Pat. No. 8,461,903 B1 does not have the same capacitance for the conducting and non-conducting states: As a result, the RF signal 96A can bring about non-linearities since positive and negative half-cycles can experience different parasitic capacitances. Such disadvantages, too, can be avoided by means of the techniques described herein.

By using the overvoltage protection element, it is possible as necessary to provide the ESD protection functionality. On the other hand—if the ESD protection functionality is not required—the effect of the overvoltage protection element can be masked out, as a result of which the RF performance of the RF switch is not impaired or is only slightly impaired.

It goes without saying that the features of the above-described embodiments and aspects of the invention can be combined with one another. In particular, the features can be used not only in the combinations described, but also in other combinations or by themselves, without departing from the field of the invention.

A description was given above of various examples with regard to applications in which the switch is implemented in a system comprising an antenna that forms an LC resonant circuit. However, corresponding techniques can also be implemented for other applications, such as e.g. a switching of matches at RF amplifiers (low noise amplifier, power amplifier) or surface acoustic wave (SAW) and/or bulk acoustic wave (BAW) filters.

A description was given above of various examples with regard to FETs which form different switching elements in each case in a stacked arrangement. In other examples, bipolar transistors, for example, could also be used instead of FETs.

In accordance with some embodiments, the following examples are presented:

EXAMPLE 1

Switch (100) comprising:
an input terminal (101),
an output terminal (102),
a stack (110) comprising transistors (111) coupled in series, said stack being coupled between the input terminal (101) and the output terminal (102),
at least one switching element (211), which is configured to be selectively operated in a conducting state or a non-conducting state, and
at least one overvoltage protection element (210) coupled to the stack (110) by means of the at least one switching element (211).

EXAMPLE 2

Switch (100) according to Example 1, which furthermore comprises:
a supply terminal (236), which is configured to provide a supply voltage,
wherein the at least one switching element (211) is operated in the conducting state or in the non-conducting state depending on a value of the supply voltage (VDD).

EXAMPLE 3

Switch (100) according to Example 2,
wherein the at least one switching element (211) is operated in the conducting state if the magnitude of the value of the supply voltage (VDD) exceeds a predefined threshold value.

EXAMPLE 4

Integrated circuit comprising:
the switch (100) according to Example 2, and
a plurality of components which are coupled to the supply terminal (236) and are operated by the supply voltage.

EXAMPLE 5

Switch (100) according to Example 1,
wherein the at least one switching element (211) is operated in the conducting state or in the non-conducting state depending on an operating mode of the switch (100).

EXAMPLE 6

Switch (100) according to Example 5, which furthermore comprises:
a user interface, which is configured to determine the operating mode by user input.

EXAMPLE 7

Switch (100) according to Example 1,
wherein the at least one switching element (211) is operated in the conducting state or in the non-conducting state depending on the presence of a radio-frequency signal (96A) at the input terminal (101).

EXAMPLE 8

Switch (100) according to Example 1,
wherein the at least one overvoltage protection element (210) is coupled at least to the transistor (111) arranged adjacent to the input terminal (101) in the stack (110).

EXAMPLE 9

Switch (100) according to Example 1,
wherein the switch (100) comprises a plurality of overvoltage protection elements (210) and switching elements (211),
wherein each overvoltage protection element (210) is coupled to a respectively assigned transistor (111) of the stack (110) by means of a corresponding switching element (211).

EXAMPLE 10

Switch (100) according to Example 9,
wherein each overvoltage protection element (210) comprises at least one capacitor (216, 217),
wherein the capacitance values of corresponding capacitors (216, 217) for overvoltage protection elements (210) assigned to different transistors (111) have a deviation with respect to one another of more than 2%, preferably more than 20%, particularly preferably more than 50%.

EXAMPLE 11

Switch (100) according to Example 9,
wherein the capacitance value of the capacitor (216, 217) of a first overvoltage protection element (210) is greater than the capacitance value of the corresponding capacitor (216, 217) of a second overvoltage protection element (210),
wherein the first overvoltage protection element (210) is assigned to a transistor (111) which is arranged nearer to the input terminal (101) in the stack (110) than the transistor (111) to which the second overvoltage protection element (210) is assigned.

EXAMPLE 12

Switch (100) according to Example 9, wherein the capacitance values of corresponding capacitors (216, 217) of the overvoltage protection elements (210) are all the smaller, the further away from the input terminal (101) the respectively assigned transistors (111) are arranged in the stack (110).

EXAMPLE 13

Switch (100) according to Example 9,
wherein each overvoltage protection element (210) comprises at least one capacitor (216, 217),
wherein the capacitance values of corresponding capacitors (216, 217) for overvoltage protection elements (210) assigned to different transistors (111) have a deviation with respect to one another of less than 50%, preferably less than 20%, particularly preferably less than 2%.

EXAMPLE 14

Switch (100) according to Example 1,
wherein each of the at least one overvoltage protection element (210) comprises a capacitor (216) coupled in series with the respectively assigned switching element (211) between the gate contact (107) and one of the source contact (106) and the drain contact (105) of a respectively assigned transistor (111).

EXAMPLE 15

Switch (100) according to Example 14,
wherein each of the at least one overvoltage protection element (210) comprises a further capacitor (217) coupled between the gate contact (107) and the other of the source contact (106) and the drain contact (105) of the respectively assigned transistor (111).

EXAMPLE 16

Switch (100) according to Example 15,
wherein for each of the at least one overvoltage protection element (210) the capacitance value of the respective capacitor (216) is in the range of 60%-140% of the capacitance value of the respective further capacitor (217), preferably in the range of 90%-110%, particularly preferably in the range of 98%-102%.

EXAMPLE 17

Switch (100) according to Example 15,
wherein for each of the at least one overvoltage protection element (210) the capacitance value of the respective capacitor (216) is not less than 1 pF, optionally not less than 2 pF, further optionally not less than 10 pF, and/or wherein for each of the at least one overvoltage protection element (210) the capacitance value of the respective further capacitor (217) is not less than 100 nF, optionally not less than 1 pF, further optionally not less than 500 pF.

EXAMPLE 18

Switch (100) according to Example 1, wherein
each of the at least one switching element (211) comprises a further transistor.

EXAMPLE 19

Switch (100) according to Example 1,
wherein the transistors (111) and/or the at least one switching element (211) comprise(s) field effect transistors.

EXAMPLE 20

System comprising:
the switch (100) according to any of the preceding examples,
an LC resonant circuit which is coupled to the input terminal (101) of the switch (100),
a ground contact, which is coupled to the output terminal (102) of the switch (100).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A switch, comprising:
an input terminal;
an output terminal;
a stack comprising transistors coupled in series, the stack being coupled between the input terminal and the output terminal;
at least one switching element configured to be selectively operated in a conducting state or a non-conducting state; and
at least one overvoltage protection element coupled to the stack by the at least one switching element,
wherein each one of the at least one overvoltage protection element comprises:
a capacitor coupled in series with a respectively assigned switching element between a gate contact and one of a source contact and a drain contact of a respectively assigned transistor; and a further capacitor coupled between the gate contact and the other one of the source contact and the drain contact of the respectively assigned transistor.

2. The switch of claim 1, further comprising:
a supply terminal configured to provide a supply voltage, wherein the at least one switching element is operated in the conducting state or in the non-conducting state depending on a value of the supply voltage.

3. The switch of claim 2, wherein the at least one switching element is configured to be operated in the conducting state if the magnitude of the value of the supply voltage exceeds a predefined threshold value.

4. An integrated circuit comprising the switch of claim 2 and a plurality of components coupled to the supply terminal and configured to be operated by the supply voltage.

5. The switch of claim 1, wherein the at least one switching element is configured to be operated in the conducting state or in the non-conducting state depending on an operating mode of the switch.

6. The switch of claim 5, further comprising:
a user interface configured to determine the operating mode by user input.

7. The switch of claim 1, wherein the at least one switching element is configured to be operated in the conducting state or in the non-conducting state depending on a radio-frequency signal at the input terminal.

8. The switch of claim 1, wherein the at least one overvoltage protection element is at least coupled to the transistor arranged adjacent to the input terminal in the stack.

9. The switch of claim 1, wherein for each one of the at least one overvoltage protection element the capacitance value of the respective capacitor is in the range of 60%-140% of the capacitance value of the respective further capacitor.

10. The switch of claim 1, wherein for each one of the at least one overvoltage protection element the capacitance value of the respective capacitor is not less than 1 pF, and/or wherein for each of the at least one overvoltage protection element the capacitance value of the respective further capacitor is not less than 100 nF.

11. The switch of claim 1, wherein each one of the at least one switching element comprises a further transistor.

12. The switch of claim 1, wherein at least one of the transistors and the at least one switching element comprise field effect transistors.

13. A system, comprising:
a switch comprising an input terminal, an output terminal, a stack comprising transistors coupled in series between the input terminal and the output terminal, at least one switching element configured to be selectively operated in a conducting state or a non-conducting state, and at least one overvoltage protection element coupled to the stack by the at least one switching element;
an LC resonant circuit coupled to the input terminal of the switch; and
a ground contact coupled to the output terminal of the switch.

14. A method, comprising:
providing a switch that comprises an input terminal, an output terminal, a stack comprising transistors coupled in series, the stack being coupled between the input terminal and the output terminal, at least one switching element configured to be selectively operated in a conducting state or a non-conducting state, and at least one overvoltage protection element coupled to the stack by the at least one switching element; and
selectively activating, using the at least one switching element, the at least one overvoltage protection element depending on at least one of the following: a value of a supply voltage; an operating mode of the switch; a user input received via a user interface; and a radio-frequency signal provided at the input terminal.

15. A switch, comprising:
an input terminal;
an output terminal;
a stack comprising transistors coupled in series, the stack being coupled between the input terminal and the output terminal;
a plurality of switching elements configured to be selectively operated in a conducting state or a non-conducting state; and
a plurality of overvoltage protection elements, each overvoltage protection element of the plurality of overvoltage protection elements being coupled to a respectively assigned transistor of the stack by a corresponding switching element of the plurality of switching elements,
wherein:
each overvoltage protection element of the plurality of overvoltage protection elements comprises at least one capacitor and the capacitance values of corresponding capacitors of the overvoltage protection elements assigned to different transistors have a deviation with respect to one another of more than 50%; and/or
the capacitance value of the capacitor of a first overvoltage protection element of the plurality of overvoltage protection elements is greater than the capacitance value of the corresponding capacitor of a second overvoltage protection element of the plurality of overvoltage protection elements, and the first overvoltage protection element is assigned to a transistor of the stack which is arranged nearer to the input terminal in the stack than the transistor of the stack to which the second overvoltage protection element is assigned; and/or
the capacitance values of corresponding capacitors of the plurality of overvoltage protection elements are smaller the further away from the input terminal the respectively assigned transistors are arranged in the stack; and/or
the capacitance values of corresponding capacitors for overvoltage protection elements of the plurality of overvoltage protection elements assigned to different transistors have a deviation with respect to one another of less than 2%.

16. A switch, comprising:
an input terminal;
an output terminal;
a stack comprising transistors coupled in series, the stack being coupled between the input terminal and the output terminal;
at least one switching element configured to be selectively operated in a conducting state or a non-conducting state; and
at least one overvoltage protection element coupled to the stack by the at least one switching element,
wherein the at least one switching element is configured to be operated in the conducting state or in the non-conducting state depending on a radio-frequency signal at the input terminal.

* * * * *